United States Patent [19]

Baker

[11] Patent Number: 4,779,039

[45] Date of Patent: Oct. 18, 1988

[54] OSCILLOSCOPE HAVING TEMPERATURE MONITOR AND RECALIBRATION FEATURE TO PROVIDE LONG-TERM HIGH ACCURACY

[75] Inventor: Clifford E. Baker, Aloha, Oreg.

[73] Assignee: Tektronic, Inc., Beaverton, Oreg.

[21] Appl. No.: 109,145

[22] Filed: Oct. 15, 1987

[51] Int. Cl.$^4$ .............................................. G01R 35/00
[52] U.S. Cl. .................................... 324/130; 324/105; 324/74; 324/121 R
[58] Field of Search ................. 324/74, 104, 105, 115, 324/121 R, 130, 73 AT; 364/487, 571; 315/364

[56] References Cited

U.S. PATENT DOCUMENTS

| 3,603,979 | 9/1971 | Kasakowski | 324/105 X |
| 3,995,263 | 11/1976 | Shreve et al. | 324/121 R |
| 4,467,279 | 8/1984 | MacCormack | 324/105 X |
| 4,663,586 | 5/1987 | Swevlein et al. | 324/130 X |

FOREIGN PATENT DOCUMENTS 63-115067  5/1988  Japan .

Primary Examiner—Reinhard J. Eisenzopf
Assistant Examiner—Warren S. Edmonds
Attorney, Agent, or Firm—George T. Noe

[57] ABSTRACT

Measurement accuracy of an oscilloscope is extended by monitoring the temperature within the oscilloscope, and automatically entering a calibration cycle if the temperature varies by a predetermined amount. A temperature sensor is strategically located within the oscilloscope to sense variations in temperature. A first sensed temperature value is stored. Upper and lower temperature limits representing the maximum permissible deviation from the stored value are calculated. Instantaneous temperature values from the sensor are compared with the stored value, and as long as the instaneous values are with the limits, an indication of extended accuracy is provided. If the instantaneous temperature values vary outside the limits, an automatic calibration cycle is initiated. After calibration, a new temperature value is stored and the monitoring process continues to ensure extended accuracy.

6 Claims, 2 Drawing Sheets

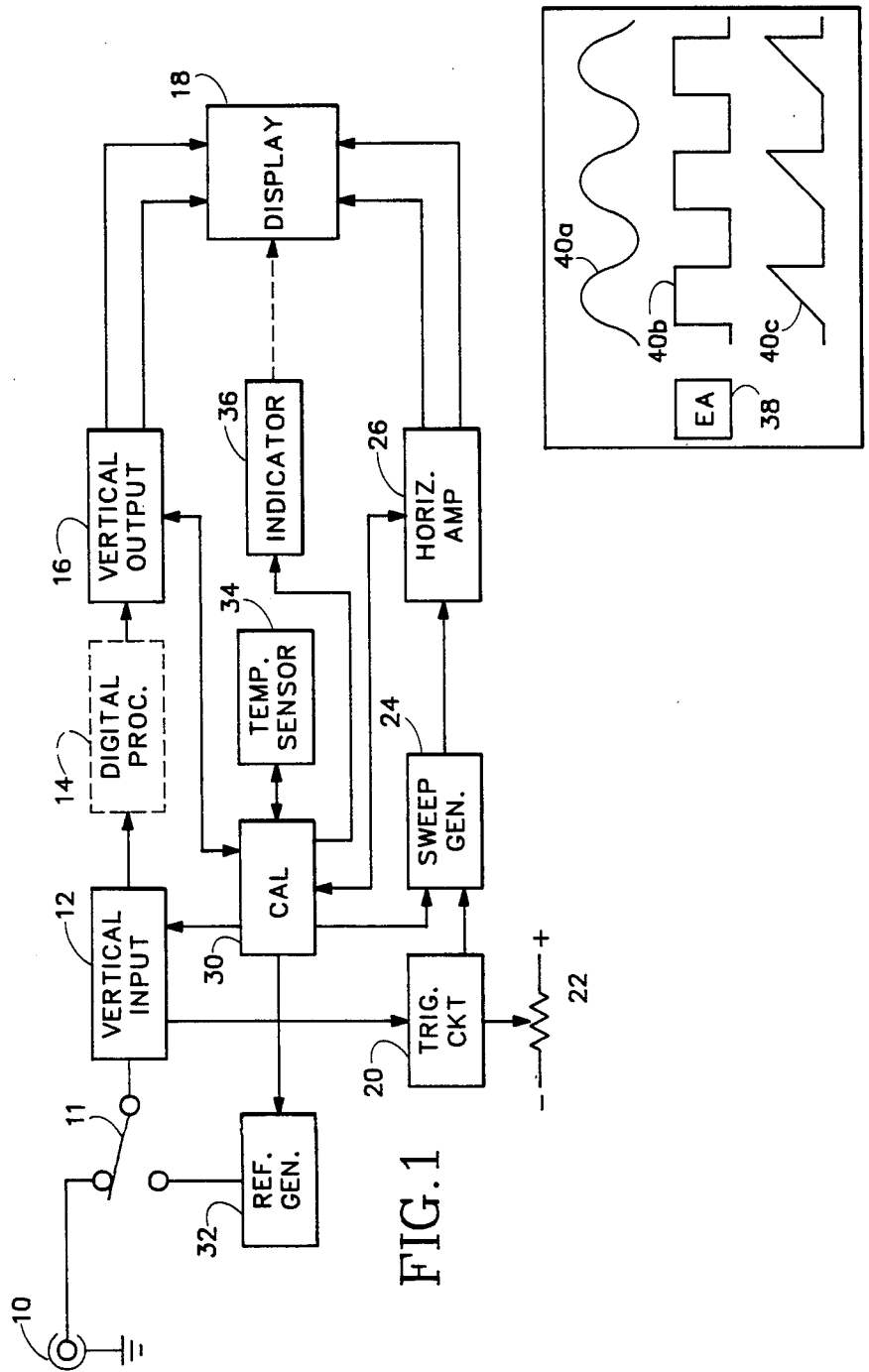

OSCILLOSCOPE HAVING TEMPERATURE MONITOR AND RECALIBRATION FEATURE TO PROVIDE LONG-TERM HIGH ACCURACY

BACKGROUND OF THE INVENTION

The measurement accuracy of precision measurement instruments, such as oscilloscopes, is subject to such conditions as ambient temperature changes, power supply voltage fluctuations, and aging of electronic components.

Many attempts have been made to increase and maintain measurement accuracy, such as using stabilized DC power supplies, temperature-compensated components where appropriate, and low-power, integrated microcircuits for signal processing.

Typically, overall accuracy for long-term instrument operation is specified at 3% over a wide temperature range, such as 0° C. to +50° C. Enhanced accuracy, e.g., 1% accuracy, may be attained in some instruments for a short time immediately following calibration, provided that the instruments remains operating, and all of the other variables (e.g., ambient temperature, etc.) remain constant. However, the actual length of this short time period is indeterminable, and therefore, such enhanced accuracy may not be suitable for long-term experiments or display photography.

SUMMARY OF THE INVENTION

In accordance with the present invention, a highly accurate oscilloscope is provided by maintaining a condition of enhanced accuracy either automatically or manually by monitoring temperature at a critical location within the instrument and initiating a self-calibration procedure if the temperature varies by a predetermined amount. Consequently, the overall accuracy can be extended to 1% or higher over long periods of time as compared with about 3% for conventional instruments.

It is therefore one object of the present invention to provide an oscilloscope with extended accuracy over long periods of time.

It is another object of the present invention to provide an oscilloscope having a temperature monitoring and calibration feature to enhance measurement accuracy.

Other objects, advantages, and attainments of the present invention will become obvious to those having ordinary skill in the art upon a reading of the following detailed description when taken in conjunction with the accompanying drawings.

THE DRAWINGS

FIG. 1 is a block diagram of an oscilloscope containing a temperature monitor and calibration feature in accordance with the present invention;

FIG. 2 is an example of a typical oscilloscope display for use in connection with the present invention;

DETAILED DESCRIPTION OF THE INVENTION

Figure 3:
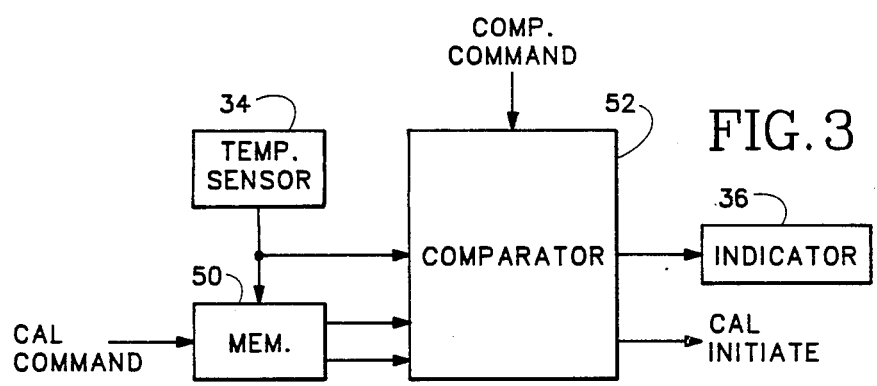
FIG. 3 is a more detailed functional block diagram of an important aspect of the present invention.

Referring to the block diagram of FIG. 1, there is shown an oscilloscope in which input signals are applied via an inpout terminal 190 and a switch 11 to a vertical input circuit 12. Vertical input circuit 12 suitably may contain conventional attenuators and amplifiers to condition the input signal, which is then passed to digital processing circuit 14 if the instrument is a digital processing oscilloscope, or directly to vertical output amplifier 16. The digital processing circuit 14 suitable may contain conventional analog-to-digital converters, digital memory, a microprocessor, and a digital-to-analog converter. The vertical output amplifier 16 splits the signal into a differential signal of sufficient magnitude to drive the vertical deflection system of a display device 18, which may be, for example, a cathode-ray tube.

A sample of the input signal is provided by vertical input circuit 12 and sent to a trigger circuit 20, where it is compared with a selectable reference voltage provided by potentiometer 22 to generate trigger signals when the signal level matches the selected reference voltage. The trigger signals are applied to a sweep generator 24 to initiate sweep signals in the form of linear ramp voltages. The sweep signals are applied to a horizontal amplifier 26, where they are split into differential signals of sufficient magnitude to drive the horizontal deflection system of display device 18.

The oscilloscope thus far described is conventional, and is included herein to provide a setting for the present invention. Shown coupled to the vertical and horizontal channels just described is a calibration circuit 30 and a precision reference signal generator 32, which provide a self calibration of vertical gain and horizontal timing for all deflection facor settings in the manner described in U.S. Pat. Nos. 4,553,091 (vertical self calibration) and 4,581,585 (sweep self calibration). Basically, operation of the calibration circuit 30 and reference signal generator 32 are as follows: Upon initiation of the calibration cycle, switch 11 is moved to connect the reference signal generator 32 output to the input of the vertical input circuit 12. The reference signal generator 32 provides signals of predetermined amplitudes and frequencies, such as square waves. The calibration circuit 30, which preferably includes a microprocessor, monitors the output of the vertical output amplifier 16, compares it with a standard reference amplitude (also provided by the reference signal generator 32), and adjusts the gain settings of the vertical amplifier channel for each deflction factor. Calibration circuit 30 also monitors the horizontal channel and adjusts the timing circuits associated with each sweep rate, and adjusts the horizontal amplifier gain. It should be noted that in the prior art automatic calibration systems, the calibration cycle is initiated either automatically on power-up, or manually in response to a command by an operator.

A temperature sensor 34 is placed within the oscilloscope at a location that permits monitoring of instantaneous temperature. The temperature sensor 34 may be any suitable heat sensitive device of conventional design, such as a platinum resistor the value of which changes with changes in temperature, a semiconductor junction, a thermistor, or like device. The instantaneous temperature sensed by temperature sensor 34 is monitored by calibration circuit 30, which first stores a temperature to be used as a reference, and then periodically compares the sensed temperature with the stored value. If the sensed temperature varies by a predetermined amount (e.g., +/−2.5 C) from the stored value, a new calibration cycle is initiated. Therefore, it can be discerned that rather than instrument accuracy degrading over the long term with changes in temperature, high accuracy may be maintained by recalibrating the signal processing channels. Also, upon such new calibration, a new temperature value is stored as a reference. Thereafter, the process is repeated as necessary to maintain high accuracy.

An indicator 36 may be provided to indicate whether the temperature is within or outside a predetermined temperature range, or more particularly, to indicate that extended accuracy is maintained. The indicator may be, for example, a light-emitting diode, or may be alphanumeric characters displayed directly upon the viewing screen of the display device 18. With reference to FIG. 2, a box 38 containing letters EA is displayed directly on a viewing screen along with waveforms 40a, 40b, and 40c to indicate that the instrument is operating with extended accuracy. This information is not only visible to one looking at the screen, but will appear on photographs of the display to ascertain validity of the high accuracy.

An implementation of a temperature sensor 34 and indicator 36 in accordance with the present invention is shown in FIG. 3. The output of the temperature sensor 34 is applied to a memory 50 and to a comparator 52. Initially, a sensed temperature value is stored in the memory 50, which may be programmed with upper and lower limit values upon a CAL command signal from a microprocessor, such as the one in the calibration circuit 30. The upper and lower limits may then be applied to the comparator 52. Upon receipt of a COMP command signal, which may be periodically applied from the microprocessor, comparator 52 compares the instantaneous temperature output from the temperature sensor 34 with the upper and lower limits from memory 50. If the instantaneous temperature is within the window defined by the upper and lower limits, a signal is sent to indicator 36 to indicate extended accuracy. If the instantaneous temperature is outside the window, a CAL initiate signal is generated and sent to the calibration circuit 30 to initiate a new calibration cycle. The window defined by the upper and lower limits may be wider for temperatures near the middle of the specified operating range, for example, around +25 C, than for temperatures near the upper or lower end of the specified operating range where it may be more difficult to maintain instrument accuracy over a long term.

After recalibration, a new temperature value is stored, and the monitoring process continues to ensure extended accuracy over long periods of time.

Figure 4:
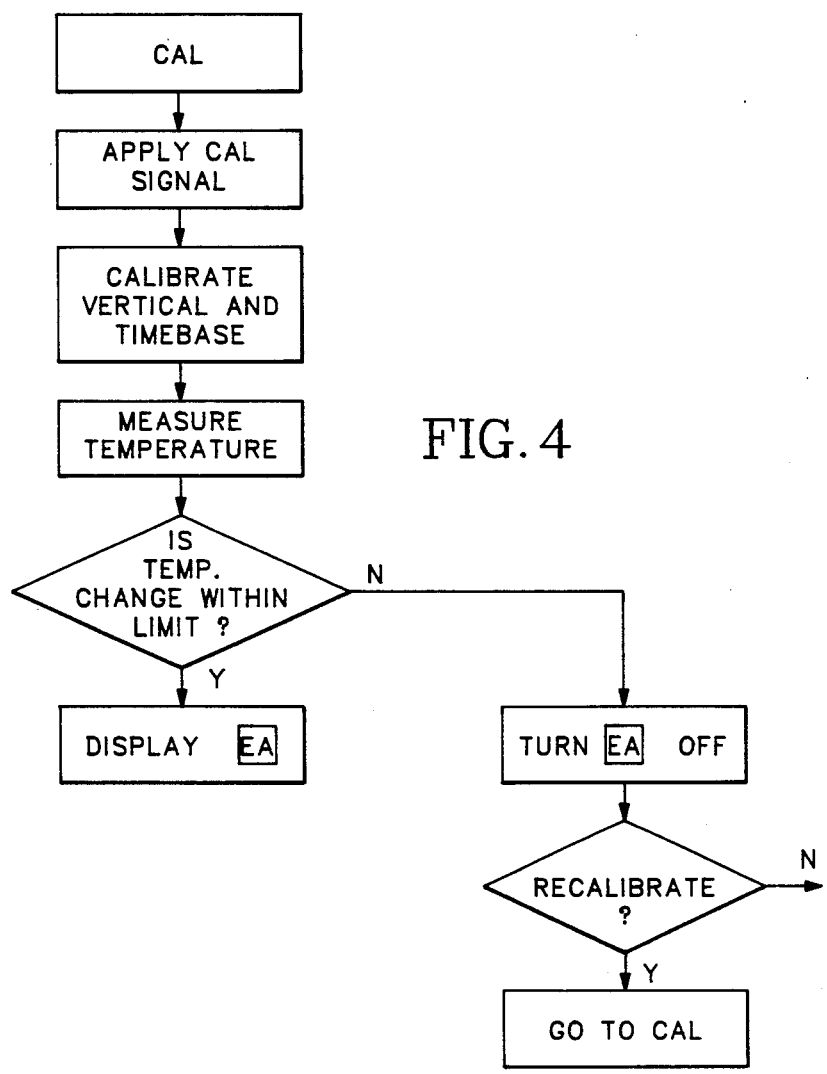
FIG. 4 is a flowchart to facilitate explanation of the calibration procedure in accordance with the present invention.

FIG. 4 shows a simple flow chart of a microprocessor program designed to operate in conjunction with the circuit of FIG. 3, and is as described in the preceding paragraph.

Although the foregoing description is made on one preferred embodiment of the present invention, it will become obvious to those skilled in the art that many changes and modifications may be made without departing from the invention in its broader aspects. For example, the invention may be implemented in either analog or digital oscilloscopes using either analog or digital circuitry, and extended accuracy indicators may be provided for each channel of a multiple-channel oscilloscope.

What I claim as being novel is:

1. A method of providing long-term high accuracy of measurements in an oscilloscope, comprising the steps of:

providing in said oscilloscope means for automatically calibrating said oscilloscope;

monitoring temperature within said oscilloscope;

generating a signal if said temperature varies by a predetermined amount; and initiating a calibration cycle by said calibrating means in response to said signal.

2. A method in accordance with claim 1 wherein said monitoring step comprises:

measuring said temperature with a temperature sensor;

storing a first temperature value from said temperature sensor in a memory;

providing upper and lower temperature limits representative of maximum permissible deviation from said stored temperature; and comparing instantaneous temperature values from said temperature sensor with said stored temperature, wherein said signal is generated if said instantaneous temperature value is outside said upper and lower limits.

3. A method in accordance with claim 2 further comprising providing an indication of extended accuracy when said instantaneous temperature is within said upper and lower limits.

4. In an oscilloscope, an apparatus for providing extended measurement accuracy, comprising:

means for monitoring temperature within said oscilloscope;

means for generating a signal if said temperature varies by a predetermined amount; and means for automatically calibrating said oscilloscope in response to said signal.

5. An apparatus in accordance with claim 4 wherein said means for monitoring temperature further comprises:

a temperature sensor for measuring said temperature;

means for storing a first temperature value;

means for providing upper and lower temperature limits representative of maximum permissible deviation from said stored temperature; and means for comparing instantaneous temperature values from said temperature sensor with said stored temperature, wherein said signal is generated if said instantaneous temperature value is outside said upper and lower limits.

6. An apparatus in accordance with claim 5 further comprising means for providing an indication of extended accuracy when said instantaneous temperature is within said upper and lower limits.

* * * * *